May 1, 1973 SHIGERU NISHIMATSU ET AL 3,730,766

SEMICONDUCTOR DEVICE AND A METHOD OF MAKING THE SAME

Filed Oct. 8, 1969

United States Patent Office 3,730,766

Patented May 1, 1973

3,730,766

SEMICONDUCTOR DEVICE AND A METHOD OF MAKING THE SAME

Shigeru Nishimatsu, Tokyo, and Takashi Tokuyama, Hoya-shi, Japan, assignors to Hitachi, Ltd., Tokyo, Japan Filed Oct. 8, 1969, Ser. No. 864,638
Claims priority, application Japan, Oct. 9, 1968, 43/73,133
Int. Cl. B44d *1/18*
U.S. Cl. 117—217 14 Claims

ABSTRACT OF THE DISCLOSURE

A method of stabilizing the surface characteristics of a silicon device wherein a first insulating layer of silicon dioxide is formed upon the silicon substrate, then a second insulating layer of alumina is deposited upon the first insulating layer and thereafter a third insulating layer of silicon dioxide is deposited upon the second insulating layer. The surface charge induced by coating said first and second insulating layers upon the surface of the substrate is controlled in accordance with the thickness of the third insulating layer.

BACKGROUND OF THE INVENTION

Field of the invention

This invention relates to a semiconductor device and a method of making the same, and more particularly to a semiconductor device having a passivation film on the surface thereof and a method of making said passivation film on the surface of the semiconductor device.

Description of the prior art

It is well known to coat the surface of a semiconductor substrate with an $SiO_2$ film, an $Si_3N_4$ film, an $Al_2O_3$ film and other film or a multiple film consisting of a combination of the above in order to stabilize the electrical characteristics of the semiconductor substrate. Specically, when the semiconductor substrate is silicon, an $SiO_2$ film is desirable in view of the thermal expansion coefficient, the ease of formation and its anti-hygroscopic property. However, the $SiO_2$ film has a tendency to increase the electron concentration in the semiconductor surface and to change the surface to n type.

The n type tendency of the surface of a semiconductor substrate appears not only in the $SiO_2$ film but also in the $Si_3N_4$ film and the $SiO_2$ film containing lead (lead glass film). The latter films have a more striking n type tendency in comparison with the $SiO_2$ film.

Due to such an n type tendency, the degree of which is easily varied by an externally applied electric field, it has been difficult to stabilize over a long period of time the electrical characteristics of the semiconductor device formed in the substrate. Particularly, a small number of ions contained in the film affects the electrical characteristics as seen, for example in the case of a field effect transistor.

On the other hand, in presence of an insulating film containing an aluminium oxide, e.g. alumina, alumina-silica, and aluminophosphosilicate glass, the p type tendency is found to appear, i.e. an increase in the hole concentration in the surface of the semiconductor substrate.

Recently, it has been attempted to combine a film having the p type tendency with an $SiO_2$ film etc. having the n type tendency in order to decrease the surface induced charges, or to form a p type surface charge induction layer (hereinafter referred to as a channel) if occasion demands.

As described above, the charges induced in the semiconductor surface by a passivation film is called a channel in the semiconductor industry, a so-called n channel in the case when electrons are induced and a so-called p channel in the case when holes are induced.

The surface concentration of electrons or holes induced in the surface of the semiconductor substrate by a passivation film can be easily determined by measuring the surface charge density $N_{FB}$ of an MIS (metal-insulator-semiconductor) structure element. For example, when an $SiO_2$ film is coated on the (111) surface of a silicon semiconductor by a well known technique, the surface is usually changed to an n type with an $N_{FB}$ of $10^{11-12}$ $cm.^{-2}$. When holes are induced, the surface is changed to a p type with a negative $N_{FB}$. When each surface density of electrons and holes induced by coating the two passivation films are equal to each other, the surface density $N_{FB}$ is seemingly zero.

In FIG. 1, an $SiO_2$ film is formed 300 A. or 500 A. thick by thermal oxidation on one principal surface (100) of a silicon semiconductor substrate having a resistivity of 50 Ω cm., and further an alumina film is formed thereon by thermal decomposition of $Al(OC_2H_5)_3$ or $Al(OC_3H_7)_3$. The relation between $N_{FB}$ and the thickness of the alumina film is shown in the figure.

As evident from this figure, it is understood that the value of $N_{FB}$ can be arbitrarily controlled by the thickness of the alumina film.

However, it is known that when the alumina film on the $SiO_2$ film is thicker than 1000 A., the electrical characteristics of the semiconductor device are remarkably deteriorated. The reason is considered to be due to the negative or positive ions effectively generated by the polarization phenomenon in the $Al_2O_3$ film.

Therefore, in order to stabilize the electrical characteristics over a long period of times the $Al_2O_3$ film, the aluminophosphosilicate glass film and the aluminosilicate glass film which are to be coated on the $SiO_2$ film should have a thickness of less than 1000 A. As seen in FIG. 1, however, this requirement restricts to a great extent the degree of freedom of the electric charges induced in the surface of the semiconductor substrate and the property thereof.

SUMMARY OF THE INVENTION

The object of the present invention is to provide an improved method for manufacturing a semiconductor device.

Another object of the present invention is to provide a novel method for controlling the amount of induced electric charges on the surface of a semiconductor substrate by coating it with a passivation film.

A further object of the present invention is to provide a method for manufacturing a stable semiconductor device and a passivation film for stabilizing the electrical characteristics thereof.

Still another object of the present invention is to provide a novel enhancement mode field effect transistor.

The gist of the present invention is to deposit a first passivation film having the property of inducing electrons and a second passivation film having the property of inducing holes with a thickness of less than 1000 A. successively on the surface of a semiconductor substrate, and to further coat them with a third passivation film having the property of inducing electrons so that the surface charge density on the surface of the semiconductor substrate formed by such double passivation films is controlled to a prescribed value, thereby providing a method for forming an improved passivation film and manufacturing a semiconductor device with such a passivation film, particularly an improved mode field effect transistor.

The first passivation film should not affect the electrical characteristics of a pn junction which is formed in a semiconductor by a diffusion method. $SiO_2$, $Si_3N_4$, lead glass, phosphorus glass, borosilicate glass or a double layer made of a combination of the above, e.g. $SiO_2$ plus $Si_3N_4$, $SiO_2$ plus lead glass, $SiO_2$ plus phosphorus glass, and $SiO_2$ plus borosilicate glass are suitable for the passivation film.

For the second film, alumina, aluminophosphosilicate glass, alumina-silicate glass and silicon dioxide diffused zinc are known to be suitable.

For the third film, $SiO_2$, $Si_3N_4$, phosphosilicate glass and borosilicate glass are used.

According to the present invention, the first film induces electrons in the semiconductor surface, that is, an n type channel while the second film induces holes to compensate for the n channel or, as occasion demands, form a p channel. The third film serves to control the amount of induced electric charges in the surface of the substrate and to improve the stability of the second film.

The influence of the third film becomes larger according as the distance between the film and the surface of the semiconductor substrate becomes smaller so that the thicknesses of the first and second films are made preferably as thin as possible. Thus, the first film has desirably a thickness of 50 to 1000 A. Below 50 A. the electrical passivation action of the pn junction formed in the semiconductor substrate is weak while above 1000 A. the above-mentioned distance becomes too large. The thickness of the second film is preferably 100 to 1000 A. below 100 A. the compensation effect against the n channel formed by the first film is weak while above 1000 A. the above-mentioned distance becomes also too large. The thickness of the third film can be arbitrarily determined by the amount of induced charges in the surface of the substrate.

The features and the effects of the present invention will be made more apparent from the following embodiments of the present invention.

DESCRIPTION OF THE PREFERRED EMBODIMENTS

Embodiment 1

Figure 1:
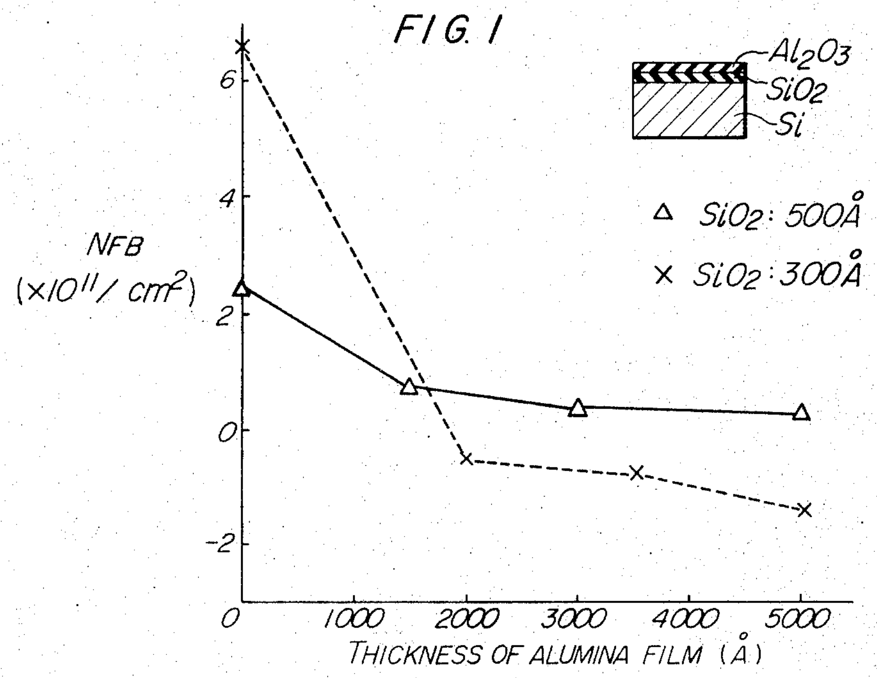
FIG. 1 shows the relationship between the thickness of the alumina film on the $SiO_2$ film and the surface charge density $N_{FB}$ appearing in the surface of the semiconductor substrate.
Figure 2:
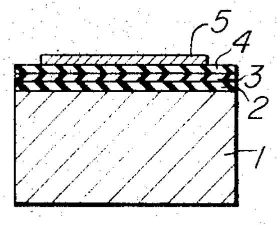
FIG. 2 shows an MIS type element according to one preferred embodiment of the present invention.
Figure 3:
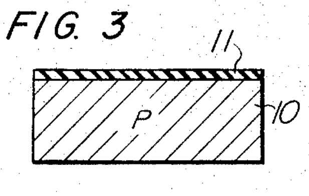
FIGS. 3 to 8 show the manufacturing processes of an n type enhancement mode MOS element according to another embodiment of the present invention.
Figure 4:
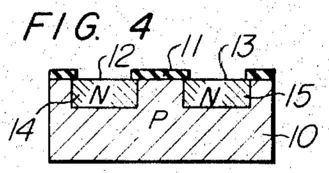
Figure 5:
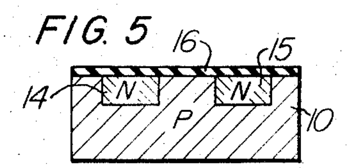
Figure 6:
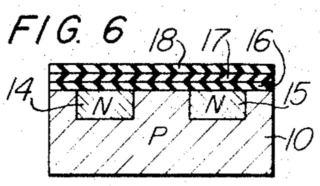

FIG. 2 shows a longitudinal sectional view of an MIS element. In this figure, reference numeral 1 designates a silicon single crystal substrate with a resistivity of 50Ω cm., reference numeral 2 designates $SiO_2$ film with a thickness of 600 A. formed by thermal oxidation, and reference numeral 3 designates an $Al_2O_3$ film with a thickness of about 1000 A. formed on the $SiO_2$ film by thermal decomposition of an organic aluminium compound such as $Al(OC_2H_5)_3$ etc. Reference numeral 4 designates an $SiO_2$ film formed by the thermal reaction of $SiH_4$ and $O_2$. Reference numeral 5 designates an Al evaporation layer provided on the $SiO_2$ film 4, which acts as one electrode of the MIS element.

The following table shows the results of the $N_{FB}$ of an element having an MIS structure.

TABLE

| Sample No. | Thickness of first layer, A. ($SiO_2$) | Thickness of second layer, A. ($Al_2O_3$) | Thickness of third layer, A. ($SiO_2$) | $N_{FB}$ ($\times 10^{10}$/cm.$^2$) |
|---|---|---|---|---|
| 1 | 600 | | | 15 |
| 2 | 600 | 1,000 | | 5.1 |
| 3 | 600 | 1,000 | 1,000 | −1.2 |
| 4 | 600 | 1,000 | 3,000 | −7.1 |
| 5 | 600 | 1,000 | 5,000 | −10 |

As shown in the table, when only one $SIO_2$ film is inserted between the electrode and the semiconductor substrate, the value of $N_{FB}$ is as large as $15\times10^{10}$ cm.$^{-2}$. With an $Al_2O_3$ film on the $SiO_2$ film $N_{FB}$ decreases to a third i.e. $5.1\times10^{10}$ cm.$^{-2}$. The third film is $SiO_2$ having a thickness of 1000 A. further decreases $N_{FB}$ to a minus value. With the increase of the thickness of the third film keeping the thicknesses of the first and second films 600 A. and 1000 A. respectively the $N_{FB}$ becomes more and more negative.

Although the reason why the value of the $N_{FB}$ can be controlled by the third film has not yet been clarified in detail, it is inferred that this may be due to the existence of effective minus electric charges near the boundary between the first insulating film and second alumina film.

The samples 3, 4 and 5 were heat treated at 200° C. with the application of a D.C. voltage of ±15 v. The measurements showed that the value of the $N_{FB}$ was changed only within the range of $\pm1\times10^{11}$ cm.$^{-2}$, indicative of high stability.

Since the surface charge density in the semiconductor substrate can be decreased in an arbitrary manner, and an n or p channel having an arbitrary $N_{FB}$ value can be formed by controlling the third film, an n type enhancement mode MOS field effect transistor which has been difficult to manufacture can be formed extremely easily.

Embodiment 2

Next, an example of forming an n type enchancement mode MOS field effect transistor using the method of the present invention will be explained.

FIGS. 3 to 8 show the manufacturing steps. Usually a large number of MOS type field effect transistors are formed in a semiconductor wafer. Here, explanation will be made of only one of these elements. The main portion is enlarged for the ease of explanation.

In these figures, reference numeral 10 designates a p type silicon substrate having a thickness of 250μ and a resistivity of 5 Ω cm. On one principal surface of the substrate an $SiO_2$ film 11 having a thickness of about 5000 A. is formed by high temperature oxidation of silicon substrate. Next, the windows 12 and 13 of the $SiO_2$ film are formed by using the photoetching method. Through these windows an n-type impurity such as phosphorus is diffused to form n type regions 14 and 15. These regions 14 and 15 become the source and drain regions of the MOS type field effect transistor. The $SiO_2$ film 11 which is used as a masking layer during the impurity diffusion is completely removed by chemical etching. A new $SiO_2$ film 16 having a thickness of 600 A. is formed on the substrate by high temperature oxidation. An $Al_2O_3$ film 17 having a thickness of about 1000 A. is formed on the $SiO_2$ film 16 by the thermal decomposition of $Al(OC_2H_5)_3$. Thereafter, an $SiO_2$ film 18 of 2000 A. thickness is formed on the $Al_2O_3$ film by heat treating $SiH_4$ with $O_2$ at 400° C.

Figures 7, 8, 9:
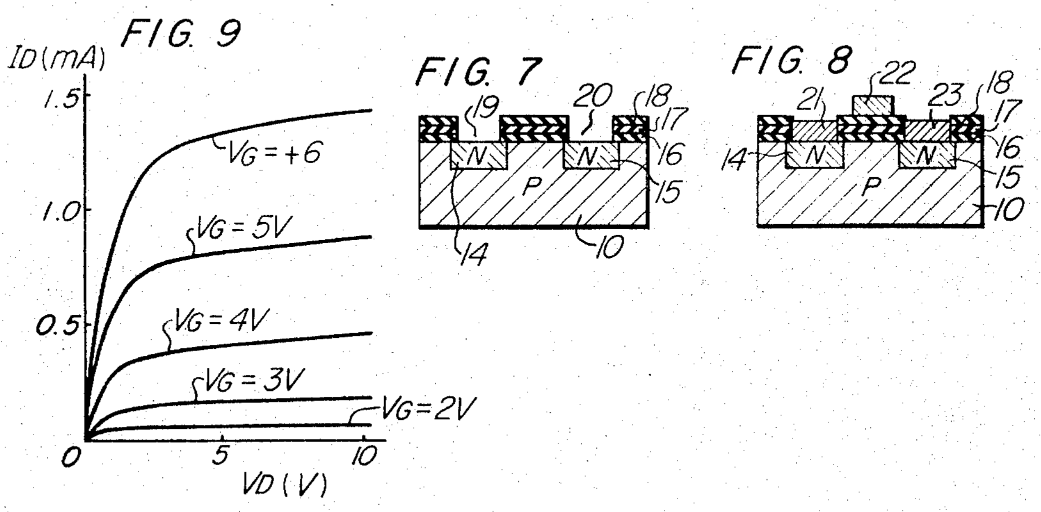
FIG. 9 shows the voltage-current characteristic of the n type enhancement mode MOS element shown in FIG. 8.

The windows 19 and 20 of the triple passivation film on the n-type regions are formed by using the photoetching method. Then, Al evaporation layers 21, 22 and 23 of 8000 A. thickness are formed in a vacuum evaporation apparatus, as shown in FIG. 8. The layer 21 becomes the source electrode of the MOS type field effect transistor, 22 the gate electrode and 23 the drain electrode.

In the surface of the semiconductor substrate covered with the triple passivation film a channel is formed for the n-type enhancement mode MOS field effect element. FIG. 9 shows the voltage-current characteristic of the field effect transistor shown in FIG. 8.

As is apparent from the foregoing explanation of the concrete embodiments of the present invention, it is understood that the surface charge density can be accurately controlled. No fear of causing instability in the electrical characteristics is seen.

The alumina system glass exhibits a rapid etching speed against HF system etchants and hence is unfavorable from the view of processing. However, this difficulty is solved by making the film thickness less than 1000 A. and coating another insulating film thereon.

Although the present invention relates to silicon, it is not always limited thereto but may be applied to other semiconductors such as germanium, GaAs, InP, InSb and GaP.

The present invention is not limited to the above embodiments alone but may be modified in various forms without departing from the sprit of the invention.

We claim:

1. A method of controlling, in a semiconductor device, the amount of surface charges induced in a surface portion of a semiconductor substrate by the effect of more than two insulating layers successively deposited on the surface portion and selected from two types of materials, of which one type of said materials has an n-type tendency as regards channel formation in the surface portion when provided on the substrate, and the other type of said materials has a p-type tendency as regards channel formation in the surface portion when applied on the substrate, comprising the steps of:

forming a first layer of an insulating material of said first type on the surface of a semiconductor substrate with a thickness of the order of 50 to 1000 angstroms, forming on said first layer a second layer of an insulating material of said other type with a thickness of the order of 100 to 1000 angstroms, and enhancing the effect of said second layer, as regards channel formation tendency, by forming a third layer of an insulating material of said one type on said second layer and controlling the thickness of said third layer to any desired large or small amount depending upon whether the desired p-type tendency from the channel formation tendency in the surface portion determined by said first and second layers is large or small, respectively, so that control in the surface charges in the finished semiconductor device is attained.

2. A method of controlling in a semiconductor device the amount of surface charges induced in a surface portion of a semiconductor substrate by forming more than two passivation layers on the semiconductor substrate comprising the steps of:

(a) forming on the surface portion of the substrate where control of the amount of the surface charges is needed a first layer of an insulating material selected from the group consisting of silicon dioxide, silicon nitride, phospho-silicate glass and boro-silicate glass and having a thickness of about 50 to 1000 angstroms, said first layer having a property capable of inducing electrons in the surface portion of the substrate thereunder;

(b) forming on said first layer a second layer of an insulating material selected from the group consisting of alumina, alumino-silicate glass, phospho-alumino-silicate glass and silicon dioxide diffused zinc and having a thickness of about 100 to 1000 angstroms, said second layer having a property capable of inducing holes in the surface portion of said substrate thereunder and effectively counteracting the electron inducing property of said first layer, so that a certain amount of surface charge which is determined by the thicknesses of the first and second layers is obtained; and (c) forming, on said second layer, a third layer of an insulating material selected from the group consisting of silicon dioxide, silicon nitride, phospho-silicate glass and boro-silicate glass, said third layer, when combined with said second layer, effectively enhancing the hole inducing property of said second layer, controlling the thickness of said third layer, so that the surface charges induced on the surface of the substrate are thereby controlled.

3. A method according to claim 2, wherein said first layer is made of silicon dioxide and is formed by heat treating the silicon substrate in an oxidizing atmosphere, and said second layer is made of aluminum oxide and is formed by heat treating in an atmosphere including the vapor of an organic aluminum compound selected from the group consisting of $Al(OC_2H_5)_3$ and $Al(OC_3H_7)_3$, and wherein said third layer is made of silicon dioxide and is formed by heat treating in an atmosphere including silane vapor and $O_2$.

4. A method of controlling the surface charges induced in a surface portion of a silicon substrate by more than two insulating layers formed on the surface portion, comprising the steps of:

(a) heat treating a silicon substrate in an oxidizing atmosphere so as to form a first insulating layer of silicon dioxide of about 50 to about 1000 angstrom thickness on the surface thereof;

(b) heat treating the silicon substrate in an atmosphere containing the vapor of an organic aluminum compound capable of forming an aluminum oxide on the surface of the first layer to thereby deposit a second insulating layer of about 100 to about 1000 angstrom thickness of an aluminum oxide upon the first insulating layer; and (c) subjecting the silicon substrate to a controllable heat treatment in an atmosphere containing silane vapor, so as to deposit a third insulating layer of silicon oxide of controlled thickness upon the surface of said second insulating layer, said third insulating layer effectively enhancing the effect of the second insulating layer as regards the surface charges induced thereby in the surface portion of said substrate, the effect of said third layer being increased as the controlled thickness thereof increases, so that desired control in the surface charges induced is attained by controlling the thickness of said third layer.

5. A method according to claim 4, further comprising the step of forming a metal layer over a part of the third insulating layer.

6. A method as defined in claim 4, wherein said organic aluminum compound is selected from the group consisting of $Al(OC_2H_5)_3$ and $Al(OC_3H_7)_3$.

7. A method as defined in claim 6, wherein said atmosphere includes $SiH_4$ and $O_2$.

8. A method of controlling the surface charges induced in a surface portion of a semiconductor substrate by more than two insulating layers formed on the surface portion comprising the steps of:

(a) forming a first insulating layer of about 50 to 1000 angstroms thickness on the surface portion of said substrate, said first insulating layer being of a material capable of inducing negative charges in the surface portion of the substrate when applied thereon.

(b) depositing a second insulating layer of about 100 to 1000 angstrom thickness on the first insulating layer, said second insulating layer being of a material capable of inducing positive charges in the surface portion of the substrate when applied thereon; and (c) depositing a third insulating layer upon said second layer and controlling the thickness of said third layer, so as to enhance the effect of the second insulating layer as regards the surface charges induced thereby in the surface portion of said substrate, the effect of said third layer being increased as the controlled thickness thereof increases.

9. A method as defined in claim 8, wherein said second insulating layer is selected from the group consisting of alumina, alumino-silicate glass, phospho-alumino silicate dioxide diffused zinc.

10. A method as defined in claim 8, wherein said third insulating layer is selected from the group consisting of silicon oxide, silicon nitride, phospho-silicate glass and boro-silicate glass.

11. A method according to claim 8, further comprising the step of forming a conductive layer over a part of said triple passivation layer.

12. A method as defined in claim 8, wherein said first insulating layer is selected from the group consisting of silicon oxide, silicon nitride, phospho-silicate glass and boro-silicate glass.

13. A method as defined in claim 12, wherein said second insulating layer is selected from the group consisting of alumina, alumino-silicate glass, phospho-alumino silicate glass and silicon dioxide diffused zinc.

14. A method as defined in claim 13, wherein said third insulating layer is selected from the group consisting of silicon oxide, silicon nitride, phospho-silicate glass and boro-silicate glass.

References Cited

UNITED STATES PATENTS

| | | | |
|---|---|---|---|
| 3,668,004 | 6/1972 | Yamamoto et al. | 117—215 |
| 3,681,115 | 8/1972 | Elgan et al. | 317—235 |
| 3,502,950 | 3/1970 | Nigh et al. | 117—217 UX |
| 3,431,636 | 3/1969 | Granberry et al. | 29—578 |
| 2,989,421 | 6/1961 | Novak | 117—106 D |
| 3,475,234 | 10/1969 | Kerwin et al. | 148—187 |

OTHER REFERENCES

B. E. Deal, P. J. Fleming and P. L. Castro, Electrical Properties of Vapor-Deposited Silicon Nitride and Silicon Oxide Films of Silicon in J. Electro Chem. Soc. Solid State Science, vol. 115, No. 3, March 1968, pp. 300 and 301.

CAMERON K. WEIFFENBACH, Primary Examiner

U.S. Cl. X.R.

117—106 R, 106 A, 215; 317—235/46.5